United States Patent [19]

Schramm

[11] Patent Number: 4,643,890
[45] Date of Patent: Feb. 17, 1987

[54] PERFORATED REACTOR TUBE FOR A FLUID WALL REACTOR AND METHOD OF FORMING A FLUID WALL

[75] Inventor: Dale E. Schramm, Borger, Tex.

[73] Assignee: J. M. Huber Corporation, Locust, N.J.

[21] Appl. No.: 647,958

[22] Filed: Sep. 5, 1984

[51] Int. Cl.$^4$ .......................... F27D 1/00; B01J 12/00
[52] U.S. Cl. .................................. 423/659; 422/151; 422/156; 422/158; 422/207; 422/241; 422/199; 373/155; 373/164
[58] Field of Search ............... 422/151, 156, 158, 166, 422/167, 207, 240, 241, 199; 55/261, 431, 435; 219/405; 432/26, 198; 423/659; 34/36; 373/155, 164

[56] References Cited

U.S. PATENT DOCUMENTS

| | | | |
|---|---|---|---|
| 3,203,763 | 8/1965 | Kruse | 422/158 |
| 3,499,730 | 3/1970 | Portes et al. | 422/158 |
| 3,933,434 | 1/1976 | Matovich | 422/240 |
| 4,012,201 | 3/1977 | Powell et al. | 422/158 |
| 4,199,545 | 4/1980 | Matovich | 422/240 |
| 4,424,026 | 1/1984 | Jensen | 432/198 |
| 4,444,726 | 4/1984 | Crotty, Jr. et al. | 422/151 |
| 4,479,809 | 10/1984 | Johnson et al. | 55/261 |

FOREIGN PATENT DOCUMENTS 1442869  5/1972  Fed. Rep. of Germany ...... 422/240

Primary Examiner—David L. Lacey
Attorney, Agent, or Firm—Harold H. Flanders; Alec H. Horn; Loren G. Helmreich

[57] ABSTRACT

A reactor tube 20 for a high-temperature fluid wall reactor has a generally cylindrical shape and is made of a refractory material which permits the tube to be heated to incandescence. The reactor tube in turn radiates energy inwardly to a reaction zone to sustain the desired high-temperature reaction. At least a length of the tube 20 is perforated to permit an inert gas to pass through the tube to form a protective fluid wall for preventing the radially-inward reactant products from contacting the inner surface 84 of the tube. Perforations 78 are located, shaped and dimensioned such that inert gas jets 86 are formed each having a substantially radially-directed momentum sufficient to repel the reactants. The injection of inert gas is controlled so that gas jets overlap to form the protective fluid wall, but the gas jets do not disturb flow within the radially-inward reaction zone. Sections of the reactor tube may remain unperforated, but are protected by the downstream flow of the injected inert gas.

23 Claims, 6 Drawing Figures

PERFORATED REACTOR TUBE FOR A FLUID WALL REACTOR AND METHOD OF FORMING A FLUID WALL

FIELD OF THE INVENTION

The present invention relates to a reactor tube for a high temperature fluid-wall reactor, and, more particularly, to a reactor tube for a reactor wherein the reaction zone spaced interiorly of the reaction tube is substantially heated by radiant energy passing through a fluid wall. The invention is also directed to a method for forming the desired fluid wall with the reactor tube as described herein.

BACKGROUND OF THE INVENTION

The present invention relates to a reactor tube for forming a high-temperature fluid-wall reactor, and to the process for enabling such a reactor tube to form an integral fluid wall for preventing reactants from contacting the interior surface of the tube. The reactor of the present invention may utilize radiation coupling, so that electrodes radiate heat to the reactor tube, which is heated to incandescence and accordingly radiates energy inwardly to maintain the desired chemical reaction within the protective fluid-wall blanket.

Heat generating reactors have been employed in various industrial processes, but conventional reactors utilizing convection and/or conduction generally are not suitable for many high temperature reactions. At elevated temperatures, the heat transfer material for such conventional reactors generally reacts with the feedstock and fails, or reactants accumulate on the heat transfer walls of such conventional reactors, thereby substantially reducing the efficiency of the thermal process. Examples of such conventional reactors are found in U.S. Pat. Nos. 2,769,772, 2,926,073, and 3,565,766.

U.S. Pat. No. 2,750,260 discloses a technique for manufacturing titanium dioxide pigment by combustion of titanium tetrachloride with oxygen. The deposition of titanium dioxide particles on the walls of the cooling zone of the reaction apparatus is suppressed by slowly diffusing a purge gas through a porous wall. The mass of the purged gas is considered controlling rather than the gas pressure or pore size of the interstices through the wall, although the pore size less than 1 mm in diameter is preferred. In the combustion zone temperatures may reach 2940° F. (1600° C.), although in the cooling zone where the reactant deposition is suppressed, the temperature is in the range of only 1140° F. (600° C.).

U.S. Pat. No. 3,499,730 discloses a combustion reactor for producing pigmentary titanium dioxide by the combustion of titanium tetrachloride in the presence of an auxiliary flame. The combustion reaction is carried out in a central flame confined within a foraminous wall tube. In the reaction zone, the cooling zone, and the recycling zone, a selected gas passes through the foraminous wall of the tube to form a barrier layer of gas which keeps particles of titanium dixoide formed in the central flame away from the wall of the tube. The gas passing through the foraminous wall of the tube also prevents the tube from reaching the temperature of the reaction zone, so that the wall may be maintained at substantially room temperature. The foraminous wall of the tube may thus be made of steel, aluminum or other metal, and perforations in the tube consists of from 2% to 40% of the wall surface.

U.S. Pat. No. 4,044,117 to Matovich discloses a fluid-wall reactor for carrying out chemical reactions at temperatures significantly higher than that disclosed in the earlier referenced patents. The reactor includes electrodes surrounded by a heat shield for heating a reactor tube made of a refractory material. The reactor tube is heated to a high temperature, and in turn emits sufficient radiant energy to initiate and sustain a desired chemical reaction which occurs within the interior of the reaction tube. Since the Matovich technique employs radiant energy rather than conduction or convection, a reactor tube material having poor thermal conductivity but relatively high temperature integrity may be utilized to form the reaction tube. This "radiation coupling" technique and its advantages over conventional reactors are fully discussed in the '117 patent.

In an attempt to alleviate the reactant and tube material reaction, and to reduce the accummulation of reactants on the interior surface of the reaction tube, Matovich utilizes a porous tube material to permit an inert gas to pass through the tube and provide a protective fluid wall for the inner surface of the tube. Various wall construction materials and types of perforations are disclosed in the '117 patent, although the reactor tube is preferably made of a porous refractory material having pore diameters in the range of from about 0.001 to 0.020 in. (0.025 mm to 0.508 mm).

The reactor disclosed in the '117 patent is thus considered a significant advancement over the prior art, since it teaches the generation of substantially increased reaction temperatures without significant deposition of reactants on the inner surface of the reactor tube. A suitable porous tube for such a reactor may be fabricated from graphite, with a wall thickness of about 0.75 in. (19 mm). Porous graphite is usually made by sintering particles of graphite coated with a carbonizable adhesive to bond the particles together. Interstices between the particles form a network of random pores though which gas can pass. It is both difficult and expensive, however, to maintain uniform porosity of the graphite material. In order to maintain reasonable porosity uniformity, the porous graphite tubes may be produced in small sections or blocks having a thickness greater than that desired. Known commercially available porous graphite tubes, not specifically intended for fluid wall reactors, are limited to a diameter of approximately 14 in. (356 cm). Since the desired fluid wall within the tube may be approximately 1 to 2 in. thick (25 to 51 mm) thick, the diameter of the inner reaction zone is limited to sizes which are frequently not commercially attractive.

The reactor of the '117 patent, although generally considered adequate for small-scale experimental work, has a number of significant drawbacks when operated on an industrial scale. Perhaps the most serious drawback is its inability to maintain a sufficient fluid wall to prevent reactants from contacting and reacting with the inner surface of the tube, especially at the location where the feedstock is input to the reaction zone. At commercial feedstock input rates, the reactants and porous tube chemically react, thus substantially reducing the life of the reaction tube. Moreover, engagement of the reactants with the porous tube tends to plug the interstices through the porous tube, thereby further reducing the effectivness of the fluid wall and decreasing tube life.

In industrial applications, the porous reactor tube of Matovich also is not capable of efficiently transmitting heat to the reaction zone in order to sustain many desired chemical reactions. For example, when a hydrocarbon oil was introduced into a commercial embodiment of the reactor at a relatively low flow rate, oil was decomposed into hydrogen and a high-quality carbon black. However, when it was attempted to increase the flow to a reasonable production rate, the produced carbon black became oily and otherwise deteriorated in quality. It was found that although the electrodes of the reactor were operating at a temperature of about 4000° F. (2200° C.), the temperature of the inner surface of the reactor tube was only about 3100° F. (1700° C.). Since the intensity of radiant energy emitted by a surface is approximately porportional to the absolute temperature raised to the fourth power, this decrease causes a reduction in the intensity of radiant energy by a factor of roughly 0.4. As a result of the reduced intensity of radiant energy in the reaction chamber, the decomposition reaction did not proceed to completion, thereby giving rise to carbon black of inferior quality. Also, after a relatively short reaction time of several hours, the porous tube failed, largely due to chemical reactions between the porous wall material and both the reactants and injected gas for the fluid wall. Some of the pores through the tube were plugged, and thus it was determined that the porous tube did not effectively maintain the desired fluid wall.

The number of chemical reactions which can be sufficiently commercialized with a reactor utilizing the porous tube of Matovich is therefore limited, because of its inability to maintain an effective fluid wall (which severely limits the life of the reactor tube), and because of its thermal inefficiency (due to the difference between the electrode temperature and the reaction temperature).

Further limitations to the Matovich reactor include the significant consumption of inert gas required to maintain a reasonable fluid wall. Significant consumption of nitrogen, a suitable inert gas, increases the reactor operating costs and demands large capacity downstream equipment for purifying the nitrogen for discharge. At elevated temperatures, nitrogen is not totally inert and does react with the graphite tube material, which structurally weakens the tube. Because of its porous nature, this nitrogen/graphite reaction occurs throughout the tube, and substantially limits the effective life of a porous tube. Finally, the nitrogen passing through the porous tube reaches substantial thermal equilibrium with the tube, thereby increasing the exit gas temperature which, in some reaction processes, must then be subsequently lowered.

The disadvantages of the prior art are overcome by the present invention, and an improved high temperature fluid wall reactor is hereinafter disclosed utilizing a perforated reactor tube. Also disclosed is an improved process for forming an effective fluid wall within a high-temperature reactor by forming a plurality of gas jets which overlap to form the protective fluid wall but do not disturb flow within the reaction zone.

SUMMARY OF THE INVENTION

A perforated reactor tube is provided for a high-temperature fluid-wall reactor. The reactor tube of the present invention permits an efficient transfer of heat from the heating elements through the reactor tube and to reactants passing through the tube. Inert gas passing through perforations in the tube enables the formation of an effective fluid wall to protect the interior surface of the tube from reactant chemical attack, and prevents reactant accumulation on the tube.

The reactor tube of the invention preferably has a generally cylindrical shape and is made of a refractory material which permits the tube to be heated to incandescence. At least a length of the reactor tube is perforated to permit a gas which is substantially inert with respect to the tube material to pass through the tube to form a protective fluid wall between the tube and the inner reaction zone. Perforations are located, shaped and dimensioned such that inert gas jets comprise a portion of the fluid wall, with each gas jet having substantial radial-directed momentum sufficient to repel the reactants. The gas jets overlap to form a continuous protective fluid wall, but do not disturb flow within the reaction zone.

The reactor tube of the present invention may be fabricated from solid graphite, which can routinely withstand temperatures of 4500° F. (2480° C.), and can withstand temperatures of 5500° F. (3040° C.) or even higher for shorter time periods. Solid graphite tubes may be fabricated relatively economically, with suitable perforations added at selected locations.

The wall of the reactor tube is preferably made as thin as practical, consistent with the requirement that the reactor tube have sufficient mechanical strength to bear up under the operating conditions of the reactor. The increased thermal conductivity of a solid wall tube material compared to a porous wall tube material, in addition to the reduced thickness of the tube wall, substantially reduces the thermal impedence presented by the tube. The perforated reactor tube of the present invention thus more efficiently transfers heat from the electrodes of the reactor to reactants passing through the reactor tube. Refractory materials other than graphite may also be used to fabricate the reactor tube, provided the material retains sufficient structural integrity at the intended operating temperatures.

According to one embodiment of the present invention, a 4 ft. (1.2 m) long reactor tube having an internal diameter of 12.75 in. (324 cm) and a wall thickness of ¼ in. (6 mm) is utilized. Perforations in the wall of the reactor tube are circular with a cross-sectional diameter of 0.03 in. (0.76 mm). The holes are located in a triangular lattice pattern with a spacing of 0.100 in. (2.54 mm) between hole centers. The perforations extend through the wall of the reactor tube in a direction substantially perpendicular to the wall. Approximately 120 scfm (3.4 scmm) of nitrogen is provided as the inert gas, and passes through the perforations creating a pressure differential of approximately 1 in. of water (2.5 gm./sq.cm.) at a reactor tube temperature of approximately 4000° F. (2200° C.).

The diameter and spacing of the holes, the thickness of the wall, and the pressure differential cooperate to form a plurality of inert gas jets each having a substantial conical configuration, with the jet apex substantially adjacent the exit opening of the perforation. Although the gas dynamics of the fluid wall are not fully understood, especially because of the elevated temperatures, the momentum of each jetstream is believed to be sufficiently radially-directed to repel reactant particles. Moreover, the inert gas jets maintain such a momentum at sufficient distance from the perforation exits, so that the jets overlap creating an integral fluid wall. It is also believed, however, that the radially-directed velocity of the jets is minimal or non-existant before the jets engage the intended reaction zone, so that the jets do not disturb flow within the reaction zone.

At the elevated temperatures previously noted, the injected inert gas achieves substantially laminar flow as the gas is swept downstream from the injection points. Laminar flow of the inert gas at a point downstream from the perforations enables the gas to maintain the desired fluid wall so that downstream perforations may be eliminated. At cooler temperatures, however, the gas is less reactive with the tube material. It may therefore be advantageous in certain cases for an upstream, and relatively cool, section of the reactor tube to be perforated while an adjacent downstream, and relatively hot, section of the reactor tube is unperforated. Also, successive sections of perforated and unperforated reactor tube may be provided in a single reactor, especially if the reactor zone is extremely long.

The reactor tube of the present invention may be fabricated in sizes sufficient to enable commercial production operations requiring high-temperature chemical processes, e.g., the production of carbon black or the destruction of hazardous waste materials. The perforated reactor tube may be used to successfully maintain a sufficient inert gas fluid wall so that the reactants do not come into engagement with the inner surface of the tube. The solid construction of the reactor tube, and the use of perforated sections only in relatively cool zones, contribute to a markedly increased tube life compared to porous graphite tubes. Moreover, the process of injecting gas through the perforations in the solid tube according to the present invention requires substantially less inert gas than was previously utilized to achieve a fluid wall using a porous tube, thus lowering reactor operating costs. Moreover, the perforated tube of the present invention has a higher resistance to chemical attack than the porous construction tubes, thereby also contributing to longer reactor tube life.

These and other features and advantages of the present invention will become apparent from the following detailed description, wherein reference is made to the Figures in the accompanying drawings. If desired, the reactor tube itself may be used as an inductive heater.

IN THE DRAWINGS

DETAILED DESCRIPTION OF PREFERRED EMBODIMENTS

Figure 1:
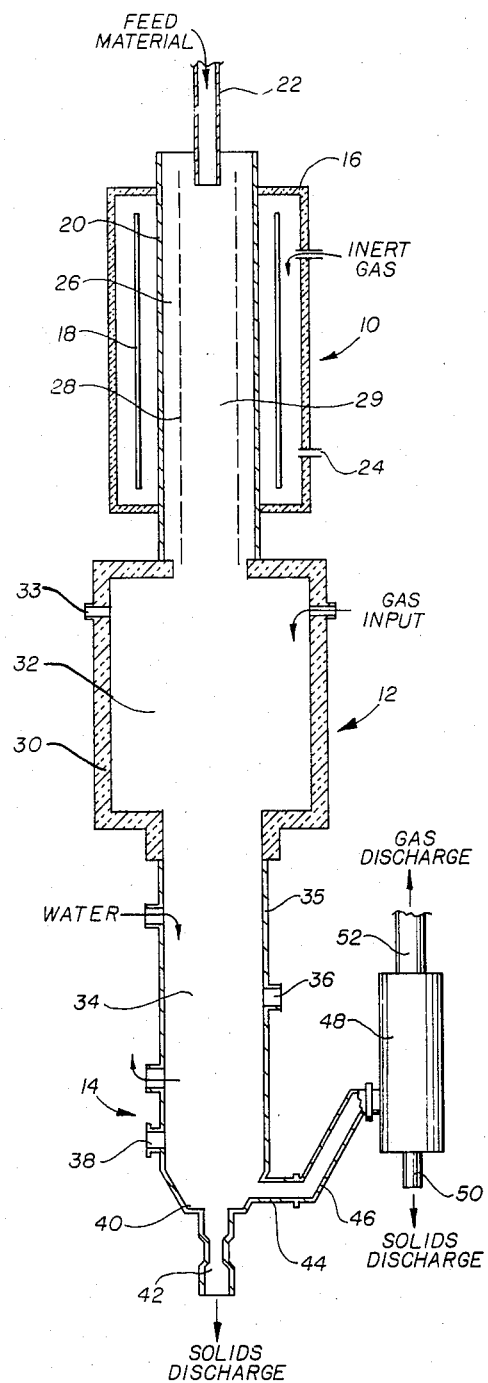
FIG. 1 is a simplified pictorial view of one embodiment of a reactor assembly including the reactor tube of the present invention.

Referring to FIG. 1, a simplified view of high temperature reactor equipment is depicted, including a reactor section 10, a post reactor treatment section 12, and a water-cooled treatment section or heat exchanger 14. As described further below, reactor material (feedstock) and inert gas are (a) fed into the reactor housing 10, wherein the feedstock is heated to a high temperature to cause a desired chemical reaction, (b) passed downward into the post reaction treatment section 12, wherein further decomposition of the reactant may occur, and (c) passed downward through heat exchanger 14, wherein the temperature of the gas and reactants are lowered for subsequent handling. For the present, it should be understood that numerous chemical reactions may be ideally suited for the apparatus herein described. The equipment shown in FIG. 1 may be used commerically, for example, to generate carbon black from hydrocarbons or to decompose hazardous waste material.

The reactor section 10 includes a generally cylindrical outer housing 16, a plurality of elongate heating electrodes 18 spaced inwardly of the housing 16, and a generally cylindrical reactor tube 20. The selected feed material may be input to the reactor by feed tube 22. The electrodes 18 generate radiant heat which is reflected inwardly by the housing 16, causing the reactor tube 20 to be heated to incandescence. Radiant heat from reactor tube 20 in turn radiates energy inwardly to sustain the desired chemical reaction within the reactor tube. Inert gas is input within housing 16 through ports 4, and passes through a plurality of apertures in the reactor tube to form an inert gas fluid wall or blanket 26 on the inner surface of the reactor tube. The inert gas blanket thus encompasses the generally cylindrical-shaped reaction zone 29 within the reactor tube, with the interface 28 between the inert gas and the reactor zone shown representatively in FIG. 1 by dashed lines.

Referring briefly to the other equipment illustrated in FIG. 1, the post reaction treatment section 12 includes a cylindrical insulated housing 30 which forms a PRTZ chamber 32. Employment of section 12 depends on the desired chemical reaction, and section 12 need not be provided in all cases. Basically, the PRTZ chamber 32 adds "residence time" to the products coming from the reactor section 10, so that further lower temperature decomposition of the gases may occur within the section 12. By way of example, the reactants may be heated to approximately 4000° F. to 4800° F. (2430° C. to 2650° C.) within the reactor section 10, and may be maintained at a temperature of between 1800° F. to 3000° F. (980° C. to 1650° C.) within the chamber 32. If desired, various gas ports 33 may be provided for injecting selected gases into the chamber 32.

The reactants and gas are subsequently input to a water-cooled heat exchanger 14 confined within a cylindrical housing 35. Conventional heat exchanger tubes (not illustrated) may thus be provided within the chamber 34, with water inlet and outlet ports 36 connecting the heat exchanger tubes to water flow lines. (Alternatively, heat exchanger coils may be provided on the outside of the housing.) With reference to the exemplary temperatures listed above, gases and reactants from the chamber 32 may conventionally be lowered by the heat exchanger 14 to approximately 500° F. to 1200° F. (260° C. to 650° C.) for further handling. If desired, a gas exit port 38 may be provided from the housing 35, although more conventionally a gas exit port 44 may be provided from transition section 40. At the bottom of the transition section 40, a discharge control 42 may be provided for discharging solid material from the chamber 34, although no appreciable gas flow from control 42 occurs. The input gases as well as the reaction-generated gases are transmitted by conduit 46 to cyclone separator 48, which in turn separates the fine particles for discharge through port 50 and discharges gas to a bag filter (not depicted) for a final cleaning operation.

Figure 2:
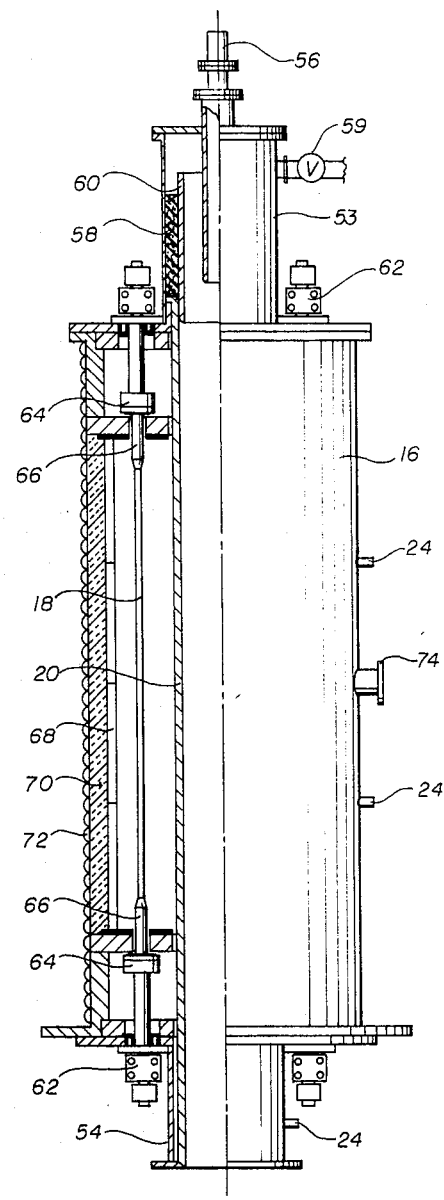
FIG. 2 is a pictorial view, partially in cross-section of a suitable high-temperature reactor section of the reactor assembly generally dipicted in FIG. 1.

Referring to FIG. 2, a more detailed, although still highly simplified, pictorial view of the reactor section 10 is shown, partially in cross-section. Attached to the ends of cylindrical housing 16 are reduced diameter input cylindrical housing 53 and reduced diameter transition housing 54, each axially aligned with the axis of the housing 16. The housing 53 supports a water cooled, adjustable feed tube mechanism 56 which supplies feedstock for the desired chemical reaction. A suitable feed tube mechanism is described in detail in commonly assigned U.S. Ser. No. 647,948, filed concurrently with this application.

The transition housing 54 provides both a physical and fluid connection between the reactor section 10 and the post reactor treatment section 12. A suitable packing material 58 may be provided between the tubular drip lip member 60 and the inner wall of the housing 53. Drip lip 60 may be fabricted from solid graphite, and serves both as an accumulation surfaces for melted solids and vapors which may condense within the housing 53, and a drip ring spaced from the reactor tube 20 so that melted solids and condensed liquids do not flow down onto the reactor tube.

Electrical power for heating the reactor may be supplied through the power clamp connectors 62, which are connected to associated power feedthrough subassemblies 64. A plurality of elongate resistance electrodes 18 preferably are uniformly spaced about the interior of the housing 16, and each electrode may be physically supported by and electrically connected at its ends to a suitable electrical connector 66.

As previously noted, housing 16 reflects radiation inwardly, so that a substantial portion of the radiant energy from electrodes 18 is used to heat the perforated tube 20. More particularly, housing 16 includes a cylindrical shaped radiation shield 68, a cylindrical insulator layer 70, and a cooling jacket 72. The insulator layer 70 and cooling jacket 72 serve to prevent significant temperature increases in the housing wall, and thereby maintain the structural integrity of the housing 16 and minimize housing warpage. A plurality of ports 74 secured to the housing 16 may be provided for attaching suitable sensing equipment to monitor conditions within the reactor.

Figure 3:
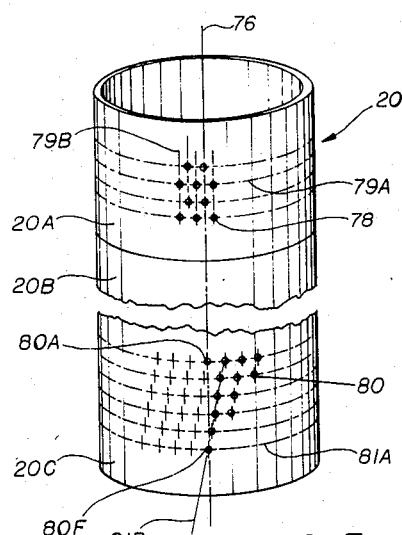
FIG. 3 is a more detailed pictorial view of a suitable perforated reactor tube according to the present invention.

FIG. 3 is a pictorial view of a suitable reactor tube 20 according to the present invention. Reactor tube 20 may be fabricated from a solid (non-porous) reactor material having a thermal conductivity in the range of 16 to 21 BTU/ft.-hr.-°F. at 4000° F. (27.7 to 36.3 watts/meter ° C. at 2200° C.), and a material strength of at least 2500 psi (176 kg/sq.cm.). Solid graphite tubes having an inner diameter of 12.75 in. (324 mm) and a wall thickness of ¼ in. (6 mm) have been successfully employed. At room temperature, solid graphite has a material strength of approximately 5000 psi (351 kg/sq.cm.) compared to approximately 500 psi (35 kg/sq.cm.) for porous graphite, so that the structural integrity of the tube is substantially increased by using solid graphite. The perforations in the tube constitute only about 7% of the total tube area, so that the thermal conductivity of the perforated graphite tube is still approximately 19 BTU/ft.-hr.-° F. at 4000° F. (32.9 watts/meter ° C. at 2200° C.). This increase in thermal conductivity (approximately 3 to 5 times compared to a porous graphite) results in a significant increase in the temperature generated within the reaction zone. Further reduction in the thickness of the perforated graphite tube may be possible, although a significant advantage of the perforated tube 20 compared to the porous graphite tube is its substantially increased reactor life, and the tube life would probably be reduced if a thinner wall perforated tube were utilized. Also, tubes may be periodically removed from the reactor and cleaned (because of a buildup on the outside of the tube discussed subsequently), and much more care would be required when handling thinner wall tubes.

Referring to reactor tube 20 depicted in FIG. 3, the tube comprises sections 20A, 20B, and 20C, with each section being identical except for the perforations. In section 20A, the perforations 78 through the tube wall are provided along circumferential lines 79A and along vertical columns 79B. (Although perforations would normally be uniformly provided around the periphery of the tube sections 20A and 20C, only portions of the tube are shown to be perforated for drawing clarity.) The holes 78 may be uniformly spaced from each other on the tube sections 20A so that the holes define lattice points of a triangular lattice pattern wrapped around the cylindrical tube. More particularly, holes 78 may be be cylindrical holes having a hole axis substantially aligned with the center line 76 of the tube 20. (The holes may be "gang drilled" in patterns 6 to 12 columns wide, so that the axis of each hole may not be directly in line with the center line 76.) The holes 78 may be spaced so that a uniform distance is provided between each of the rows 79A, which distance is approximately 1.55 times the uniform distance provided between each of the columns 79B, and the holes 78 are thus uniformly spaced from each other in a triangular lattice pattern.

Tube section 20C includes cylindrical-shaped holes 80 similar to holes 78, except that holes 80 define lattice points of a rhomboid lattice pattern and are provided along circumferential lines 81A and along spiral columns 81B. The spiral or helical lines 81B may also be spaced at equal intervals, with a suitable pitch for the helical lines 81B resulting in hole 80A (spaced five or more rows above hole 80F) being directly vertical over hole 80F. Advantages of a triangular, rhomboid and square lattice pattern are discussed subsequently. For the present, however, it should be understood that exemplary cylindrical holes 78 and 80 may have a diameter of 0.030 in. (0.76 mm) and may be spaced on the tube exterior surface at centerline spacings between holes of 0.100 in. (2.54 mm).

Using an exemplary perforated tube having a 12.75 in. (324 mm) internal diameter (as previously described) which is 4 ft. (1.2 m) long and is perforated with holes having a diameter and spacing as described above and arranged in the configuration of holes 78 throughout the length of the tube, a suitable method for forming a fluid wall will be discussed. After the heating elements have radiated the tube 20 to its intended operating temperature, pressurized inert gas may be injected into the interior of the housing 16. Gases typically have a very low radiation absorption rate, so that the gas would not necessarily be heated to the temperature of the heating elements.

A pressure differential of between 0.5 to 4 in. of water (1.3 to 10.1 gm/sq.cm.) may be created as the gas is passed through the perforations in the tube. This pressure differential preferably is sufficient to insure a uniform flow through the perforations in the tube, but is not so high as to cause unnecessary turbulence in the interior of the tube. Typically, gas may be injected into the tube described above at rates of between 40 to 240 scfm (1.1 to 618 scmm), and normally below 150 scfm (4.2 scmm). Gas injection rates in terms of area of perforated tube internal surface in the range of from 3.0 scfm per square foot of tube area to 11.3 scfm per square foot of tube area are thus preferable. If desired, a low volume of sweep gas less than 20 scfm (0.57 scmm), may be input into the top of the reactor through control valve 59 (see FIG. 2).

It is believed that flow in the tube perforations is laminar. Depending on the assumed temperature of the gas in the perforations and the gas flow rate, the exit velocity of the jet has been approximated at between 1 and 50 feet (0.30 to 15.2 meters) per second. It is presently believed that the jetstreams commencing at the exit of the perforations are also laminar, although portions of these jetstreams could also be turbulent due, in part, to intermixing of jetstreams and cross-flow (axial flow) of gas injected upstream. Each inert gas jetstream is directed downward through the tube, as explained below. If the perforations in the tube are discontinued downstream, inert gas flow downstream of the perforations is believed to be substantially laminar. Thus, the combination of radially-directed gas jets and the subsequent axially moving inert gas form the desired fluid wall to enable the reaction process to occur without having reactants contact the interior surface of the tube.

Tube sections may be from less than one foot to several feet in length, and perforations are normally uniformly provided substantially along the length of each perforated section and uniformly about the circumference of each perforated section. Typically, thousands of holes would be provided in a perforated tube section, and thus substantial costs may be incurred when manufacturing perforated tubes according to the present invention.

The selection of a suitable hole diameter and hole spacing for the perforations will depend on the particular reaction process desired. If the perforated area per unit surface area remains constant, a decreased hole spacing will increase the number of holes and should theoretically provide a more uniform inert gas blanket. If the same flow rate of inert gas is utilized, however, a decrease in the hole diameter and hole spacing may increase the pressure differential across the tube, thereby raising the velocity of the inert gas jets. Also, a decreased hole spacing obviously increases the cost of manufacturing the reactor tube. A hole diameter of between 0.02 in. (0.51 mm) to 0.20 in. (5.1 mm) should generally be satisfactory, with the uniform hole spacing of between 0.05 in. (1.3 mm) to 0.50 in. (12.7 mm). A hole size/hole spacing chart is listed below:

| Hole Diameter Inches | Hole Spacing Inches | Comments |
|---|---|---|
| .02–.035 | .06–.15 | No reactant deposition on tube under various operating conditions. |
| .05–.07 | .12–.25 | No reactant deposition on tube under many operating conditions. |
| .08–.10 | .18–.35 | Little or no reactant deposition on tube under more controlled operating conditions. |
| .12–.20 | .30–.45 | Probable upper limit for acceptable performance under conventional industrial operating conditions. |

From the above, it should be apparent that a reduced hole size and spacing is generally preferred, with machining costs being the primary motive for increased hole spacings. Also, the larger hole sizes and hole spacings may be more acceptable in perforated tube sections downstream from the feedstock input to the reaction zone. Perforations having a mean diameter in the range of from 0.03 inches to 0.09 inches, with said perforations having centerline spacings of from 0.10 inches to 0.30 inches are preferable.

It may also be desirable to provide a cylindrical tube section 20B which is unperforated. Tube sections can be drilled and section ends either sealingly glued or machined to be fitted to unperforated tube sections, so that inert gas can pass into the interior of the tube only through the perforations provided. The inert gas forms a fluid wall between the reaction zone and the interior wall of the tube 20. A representative interface between the inert gas and the reaction zone is shown in FIG. 1 by the dashed lines 28.

Figure 4:
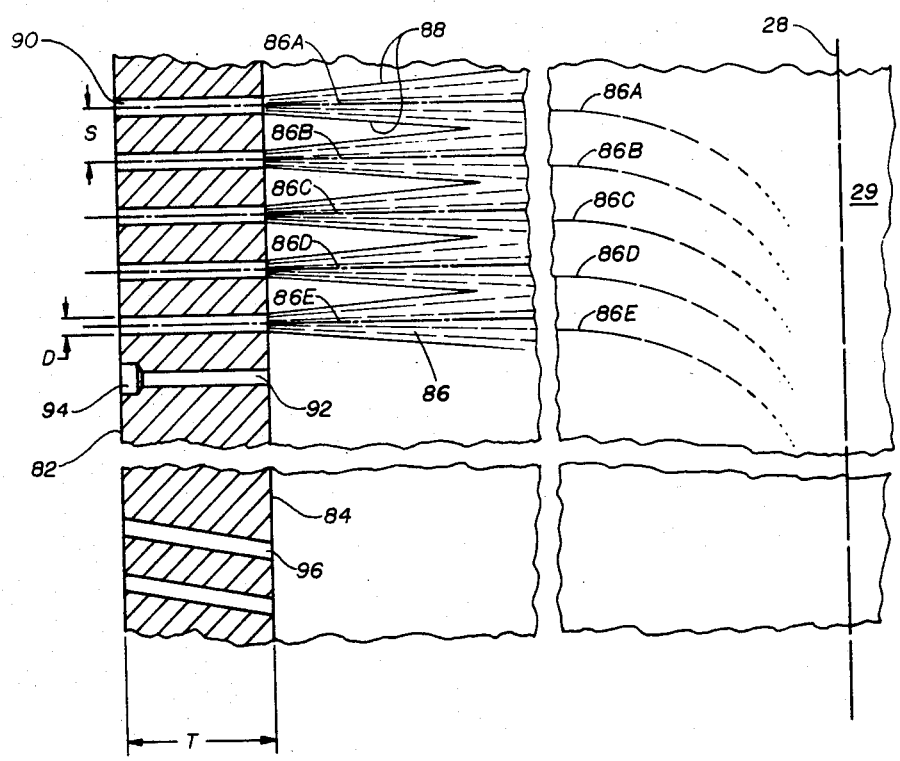
FIG. 4 is a cross-sectional view of a portion of the wall of a suitable reactor tube.

Referring now to FIG. 4, there is depicted a cross-section through a portion of a perforated tube provided with holes formed in a rectangular pattern. A tube wall having a wall thickness T of 0.25 in. (6 mm) has an exterior surface 82 and an interior surface 84. Circular perforations 90 having a diameter D of 0.03 in. are provided through the tube at a hole to hole center line spacing S of 0.100 inches.

Inert gas flows through the perforations 90 and achieves fairly uniform flow within the perforations because of the D/T ratio. An inert gas jet 86 is formed commencing from the end of the opening 90, with the center line of adjacent lower gas jets being designated as 86A–86E. The boundary layer 88 of each jet expands outwardly from the center line as the jet progresses from the interior surface 84, and thus each jet may be described as having a substantially conical configuration with the sidewalls of the cones (or the sidewalls of the jets) intersecting at some distance from the interior surface 84. After the jets intersect, a uniform fluid wall is thereafter established, and the jet velocity will continue to decrease as the jet moves further from the interior surface 84.

Within the boundaries of a singular jetstream, the velocity of the gas at any point remains substantially constant, in both magnitude and direction, and there is no mixing of the gases within the jetstream on a macroscopic scale. Once the jetstreams shown in FIG. 4 intersect, however, additional mixing or turbulence may occur, which further explains the difficulty in determining whether the jetstream is laminar or tubulent after jetstreams have intersected. In any event, the hole spacings are believed to be critical to the success of the present invention, and it is believed that the jetstreams maintain sufficient momentum at the point of intersection to form a uniform boundary layer sufficient to repel reactant particles.

Inert gas injected above jet 86 as well as the downward flow of the reactants within the reaction zone in the interior of reactor tube 20 create a cross-flow generally perpendicular to the initial flow of jet 86 (the cross-flow direction being axial with respect to the reactor tube 20). The center line 86A of jet 86 is therefore directed downwardly as shown in FIG. 4 as the jet moves further from the interior wall 84, with the rate of downward change in the direction of jet 86 increasing as the radially-directed velocity of the jetstream is reduced and the jet is increasingly affected by the cross-flow. Since the actual pattern of the jetstreams is not known, the jet center line representations shown in FIG. 4 should be understood to merely illustrate the functional concepts described herein.

The gas streams should cooperate to repel reactant particles from engaging the inner wall 84 of the tube 20, and it is believed that this repulsion is made possible because each jet maintains a sufficient radially-directed momentum to repel reactant particles at least until the jetstream overlaps with other jetstreams. Once jetstreams having such momentum overlap, an effective continuous fluid wall is created. Thereafter, the radially-directed velocity of the jets will decrease and the inert gas ultimately will flow in an axial direction having no substantial radial component, as shown in FIG. 4. It is also believed that the success of the present invention, in part, is due to the fact that the gas jets lose substantially all their radially directed velocity outside of the reaction zone. In other words, inert gas at or near the interface 28 with the reaction zone is not moving radially with respect to the center line of the tube 20, and therefore does not penetrate the reaction zone interiorly of interface 28 to disturb the fluid flow within the reaction zone. Also, it is believed that reactant gas flow within the reactor zone is substantially laminar, at least after a distance of several feet downstream from the feedstock injection, which enables the axially-moving inert gas to continue to act as an effective fluid wall downstream of the perforations.

It should be apparent from the foregoing discussion that the various phenomenon contributing to the ability of the perforated tube of the present invention to successfully maintain a fluid wall sufficient to prevent reactants from contacting the inner surface of the tube is not fully understood. Theoretical gas dynamics concepts such as viscosity, laminar flow, and gas density and momentum are, of course, significantly altered by high temperatures. Also, empirical data is very difficult to obtain because of the elevated reaction temperatures previously discussed. The perforated tube described above achieves surprising and unexpected results, especially relating to its ability to form and maintain a fluid wall, and the above explanation for its success is presently believed to be valid.

FIG. 4 also illustrates perforation 92 having a larger diameter at the exterior wall 82. This increased diameter area 94 may be utilized to reduce frictional fluid losses at the entrance to perforation 92, and may also be desirable from a hole manufacturing standpoint if the wall thickness T exceeds 0.3 inches. The entrance of perforation 92 may also be cone-shaped or rounded to further reduce frictional entrance losses and/or turbulence.

FIG. 4 also depicts downwardly angled cylindrical perforation 96. The axis of perforation 96, if extended, would intersect or pass closely to the center line 76 of tube 20, and in that respect perforation 96 is similar to perforations 90 or 92. The axis of cylindrical perforation 96 is projected downwardly (toward the fluid exit of tube 20) so that a jet commencing from perforation 96 is initially imparted with an axially directed velocity in the direction of the ultimate inert gas flow. This inclined jet concept has not been adequately tested to determine its effect, although it is believed that a plurality of downwardly injected jets may decrease turbulence within the tube and more readily enable the generation of an axially moving laminar fluid wall. It is also believed, however, that such downwardly inclined jets may have a detrimental influence on the ability of the jets to repel reactants, due to the reduction in the radially-directed momentum of the jetstreams. A preferred range of angles, if any, for the downwardly projected jets 96 therefore has yet to be determined.

It has sometimes been observed that when the reactor is operating under conditions such that some reactive products contact the interior of the core (which condition would likely occur according to the teachings of the present invention only under abnormal operating conditions), vertical "paths" substantially corresponding to the width of the holes appear on the inner surface of the reactor tube 20 below each perforation. It has also been observed that this "path" area below each hole may extend substantially beyond the spacing of the lower row of holes. This "path" effect is believed to be due to increased nitrogen flow over that portion of the tube surface, which, in turn, may be due to the "wake" effect of the jet. In any event, this "path" is believed to be desirable especially under abnormal operating conditions, since interior surface tube material in this path remains substantially in its virgin state, while material between such paths experience a slight amount of degregation (microscopic builddown) over an extended period of time. An advantage of the spiral configuration of the holes 80 shown in FIG. 3 is that the spiral offset allows the "path" inner tube surfaces to overlap, thus effectively obtaining a totally virgin-state inner surface of the tube rather than obtaining a "paths" along the vertical column 79B. In other words, an advantage of the spiral arrangement of the holes 80 as shown in FIG. 3 is that the "path" below hole 80A may extend vertically downward five or more rows past hole 80F, and the elongate path under each of the holes thus overlaps to effectively provide a "virgin state" inner tube surface. Thus, it should be understood that regardless of the particular hole arrangement, an effective fluid wall should be formed according to the present invention to keep reactant products from contacting the tube interior wall under normal reactor operating conditions. Because of this "path" effect, the spiral hole arrangement may have advantages to minimize tube deterioration under abnormal operating conditions.

As previously noted, extended life of the perforated reactor tube compared to porous tubes is a significant feature of the present invention, and the drilled tube should be able to structurally withstand compressive forces on the tube when operating at high temperature for extended periods of time. It has been determined that the entrance openings for the perforations may tend to increase with a conical configuration as the tube life increases. This conical increase or erosion of the entrance areas of the perforations is generally symmetrical with respect to the center line of each perforation, and after a relatively long period of time, the erosion of the outer wall adjacent the opening of each hole effectively decreases the compressive strength of the tube, the tube strength being effectively determined by the strength of the "columns" of core material between the columns of holes.

These tube material columns are spaced between corresponding holes are thus truly vertical for a square or rectangular hole pattern, but would be spiralled for the hole pattern of holes 80. Since a strictly vertical column can possibly support much more weight before failing than columns spiralling about a center line, a square or rectangular lattice pattern may be preferable over the arrangement of the holes 80 to minimize the likelihood of tube structural failure over a long operating period.

A triangular hole pattern offers increased "cleaned path" surfaces compared to a square hole pattern, while still retaining narrower vertical outer wall columns between holes. A hexagonal or outer hole pattern may also be used, depending on the desired tradeoff between reactor tube strength and the efficiency of the hole pattern in forming and maintaining a fluid wall.

As indicated above, it may be desirable to include both a solid (non-porous) and unperforated section of the tube within the reaction zone. A perforated section of the tube may be essential in the vicinity where the feedstock is input into the reactor. At this input location, individual particles of reactant material and reaction-created gas molecules may have a substantial radial as well as axial velocity, due to the intensity of the chemical reactions and the creation of new reaction gases. This supposedly turbulent condition results in reaction particles in the range of up to approximately 0.5 mm being thrust with a radially-directed velocity toward the reactor tube, and these particles are repelled from contacting the inner surface of the reactor tube by the opposing radially-directed momentum of the overlapping jets.

Several feet downstream from the feed material injection locations, however, the individual reactor particles and reaction gas molecules within the reaction zone will necessarily have achieved substantially axially movement with respect to the tube. It has been determined that although radially-directed inert gas jets may be necessary in the region adjacent the feed input, the injected inert gas flowing downstream continues to maintain a fluid wall blanket. This axially moving fluid wall creates a sufficient barrier to prohibit the inner axially moving reaction gases and reactant particles from coming into engagement with an unperforated tube wall section. Moreover, this axially moving inert gas can create an effective fluid wall under these conditions over a distance of at least several feet. The flow of the inert gas downstream of the jets and the flow of reaction gases at this location are thus considered laminar.

Figure 5:
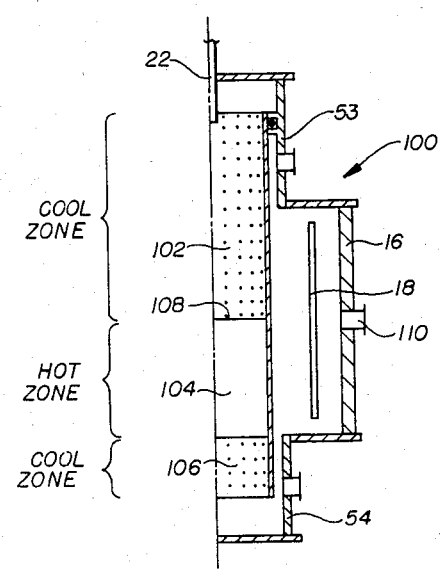

FIG. 5 illustrates a simplified cross-sectional view of a reactor chamber including a modified reactor tube. (In both FIGS. 5 and 6, the holes shown are intended simply to illustrate a perforated tube, and the hole spacings are not in proper proportion to the reactor tube.) The reactor includes the cylindrical housing 16 for the heating elements 18, as previously discussed. The feed tube 22 terminates within the upper housing 53, and the lower housing 54 provides a transition to the downstream equipment. The reactor tube shown in FIG. 5 comprises three separate reactor tube sections: a perforated tube section 102 extending from the top of the tube until about the middle of the housing 16, a solid and unperforated tube section 104 extending from tube 102 to position adjacent the lower end of the large cylindrical housing 16, and a perforated tube section 106 extending from the tube 104 to the lower end of the reactor tube. Each of these tube sections is axially aligned and may be sealingly joined by conventional means.

Inert gas may be injected through one or more of the ports 110 for passing inert gas through the perforations in section 102 to form the desired fluid wall comprising a plurality of radially projecting jets in the vicinity of the feedstock input. By the time the feed material and reactor gases reach the middle of the housing 16, the reactor material and gases within the reaction zone should be moving substantially axially with respect to the axis of the tube. An unperforated tube section 104 of several feet or more in length may thus be provided, with the fluid wall being maintained by the laminar axially moving inert gas flow, as described above. Within cylinder 54 adjacent the exit of the reactor section, turbulence within the reactor tube may be increasing, and the fluid wall may begin to break-down. Accordingly, another perforated section of reactor tube 106 is provided to insure that the reactant particles do not come into engagement with the lower end of the reaction tube.

It has been further observed that material may eventually accumulate on the outer surface of the reactor tube as the reactor is operated over a long period of time, especially in a relatively cooler zones of the reaction chamber. It is believed that this buildup of material is at least partially caused by condensation of carbon or graphite vapors formed outside of the reactor tube in the hot zone adjacent the heating elements. This vapor cools and condenses when entering a cooler zone, and may thus build up on the outside of the reactor tube, thereby possibly plugging some of the perforated holes. Accordingly, it may be necessary to periodically clean the outer wall of the perforated sections of the reactor tube to remove this buildup.

To reduce the above buildup on the outside of the reactor tube, inert gas may be input into the reactor only in the vicinity of the perforated tube sections. To further reduce or eliminate the buildup, inert gas may be input into a chamber in fluid communication with the perforations in a perforated section of the tube, but sealed from the adjacent unperforated sections of the tube. An unperforated section of the tube is preferably provided in a hot zone, since this is the zone which would otherwise most likely experience tube failure due to the extended temperatures and corrosion of the outer wall. Accordingly, it may be desirable under certain conditions to inject inert gas only in the vicinity of the cool perforated tube sections, or to isolate the exterior of the unperforated hot-zone tube section from the exterior of the perforated cool-zone tube section, thereby reducing the buildup on the outside of the perforated tube section.

Referring again to FIG. 5, inert gas may thus be injected through ports 110 in housings 53 and 54, while port 110 in housing 16 is sealed. The closing of port 110 in housing 16 should reduce the buildup on the outside of perforated tube sections 102 and 106, since the injected gas need not pass by the elements 18 before entering the perforations in the tube.

Figure 6:
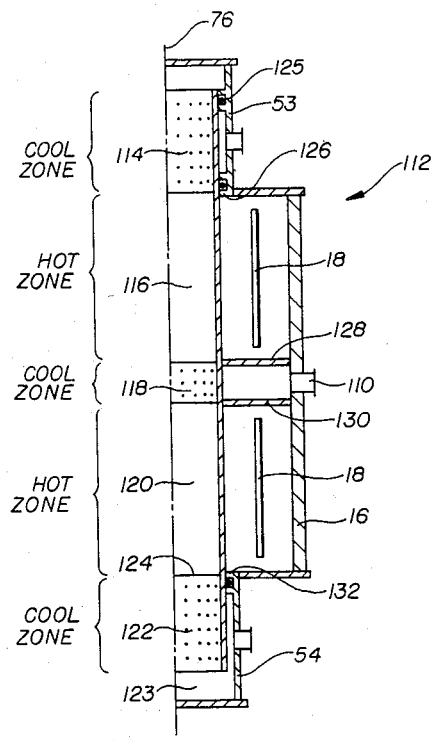
FIGS. 5 and 6 are each simplified pictorial views of alternate embodiments of reactor tubes within suitable reaction chambers.

Referring to FIG. 6, another reactor is shown, with a reactor tube comprising alternating perforated and unperforated sections 114, 116, 118, 120, 122, and 123. Each of the perforated sections is sealed outwardly from the unperforated sections by graphite packing rings 125 and/or other horizontal barrier layers. Thus, the perforated section 114 is sealed from the chamber outside of the unperforated section 116 containing the heating elements 18. Similarly, perforated section 118 is sealed from adjacent unperforated sections by horizontal barriers 128 and 130. Each of the perforated sections shown in FIG. 6 is provided with its own inert gas input 110. Accordingly, inert gas entering the reactor tube need not be in fluid communication with the hot portion outside the unperforated section of the tube adjacent the heating elements 18. As previously indicated, the fluid dynamics of the inert gas will largely depend on the gas temperature. In the embodiment shown in FIG. 6, the inert gas may not be as hot as the gas passing through the tube of the embodiment shown in FIG. 5. In order to maintain the desired inert gas characteristics, the inert gas provided to the perforated sections of the tube shown in FIG. 6 may be preheated by conventional means.

FIG. 6 illustrates that a short perforated tube section 118 may be provided between an otherwise elongate hot zone. Laminar flow of inert gas within the unperforated section 116 may begin to break down, and perforated tube section 118 is provided to reestablish a strong fluid wall and again commence uniform laminar flow of the inert gas adjacent the interior of the unperforated section 120. FIG. 6 also illustrates that unperforated sections of the reactor tube may be provided in the area generally adjacent the heating elements, while perforated tube sections are provided in the relatively cool reactor zones. Finally, restricting the flow of inert gas from the heating elements 18 as shown in FIG. 6 may extend the life of the heating elements, although additional life from the elements 18 may also be obtained by using another inert gas, such as argon.

To further maximize the efficiency of the fluid wall formed within the perforated reactor tube, it may be desirable to provide perforated tube sections wherein the hole size, hole spacing, and hole orientation vary depending upon the intended placement of the tube section relative to the feedstock input location and the heating and cooling zones. As an example, perforations in sections 118 and 122 may be angled downwardly, as previously described, to achieve a uniform downstream laminar fluid wall without generating a strictly radially-directed pattern of jets, since fluid gas and reactants entering these zones should be moving substantially in the axial direction. Similarly, it may be possible to increase the hole spacing in sections 118 and 122 or reduce the gas flow rate per unit area for these tube sections compared with the hole spacing and gas flow rate used for section 114. It may be feasible to replace unperforated tube sections with sections having large diameter perforations at very large spacings, and to substantially reduce the gas flow per unit area to such a tube section. The gas passing through such large perforations may act primarily to enhance uniform laminar flow, and overlapping of gas jets having a substantially radially-directed momentum would not be obtained.

It should be apparent that the embodiments herein described achieve numerous advantages over reactors utilizing porous tubes as described in U.S. Pat. No. 4,044,117. The perforated tube allows for a much stronger fluid wall to repel reactants than was obtained using the porous tube. The perforated tube of the present invention requires much less inert gas than the porous tube, thus both reducing reactor operating costs and allowing the downsizing of gas purification equipment. The increased thermal conductivity of the reactor tube compared to porous reactor tube results in a higher reaction temperature and therefore increases the reactor efficiency. Compared to porous reactor tubes, the perforated reactor tube of the present invention has a relatively high resistance to chemical attack due to its non-porous nature, and is much stronger than a porous reactor tube, as previously explained. It is therefore believed that the perforated tube may typically have a reactor life of at least fifty times the life of a porous tube.

The present invention thus makes feasible the commercial operation of a reactor utilizing a perforated tube diameter of from 14 to 60 inches. Such a reactor may, for example, be used to commercially produce carbon black, to gasify coal by pyrolysis, to decompose hazardous waste materials, to thermally crack petroleum products, or to reduce oxides of inorganic compounds in the presence of hydrogen. Numerous other possible uses for the high temperature fluid wall reactor are disclosed in U.S. Pat. No. 4,044,117, which are incorporated herein by reference.

It is also within the concept of the present invention to utilize inductive heating rather than resistance heating. Thus, the electrodes described herein could be replaced with inductive heaters, which would similarily radiate energy to the reactor tube, which in turn would radiate the reaction zone to sustain the desired chemical reaction. The core itself may be used as the heater. Large inductive heaters are commercially available, so that the commercial scale-up of such a reactor is feasible. The use of inductive heaters compared to resistance heaters may also increase the heat transfer efficiency to the feedstock, and may eliminate some difficulties associated with the use of resistance electrodes operating within high temperatures environments.

The reactor tube of the present invention is thus particularly useful for a high-temperature fluid wall reactor wherein the reaction zone spaced within the interior of the tube is substantially heated by radiant energy. In many instances, this radiant energy is absorbed by the reactant itself, which raises the temperature within the reaction zone so that reaction gases within the reaction zone (having a relatively low radiation absorption coefficient) are heated by both convention and radiation. U.S. Pat. No. 4,044,117 teaches that if the reactant itself does not exhibit a high radiation absorption rate, a "target material" may be added to the reaction zone to raise the temperature in the reaction zone. The tube of the present invention is well suited for radiation coupling type reactors, wherein radiation heaters radiate a tube which in turn radiates a radially inward reaction zone. Alternatively, a tube material having a very low radiation absorption coefficient may be used, so that radiation from heaters passes through the tube, and the reaction zone is thus radiantly heated directly by the heaters exterior to the tube.

The reactor tube may be fabricated from graphite, as described above, although many other refractory materials may be used. Examples of other suitable reactor tube materials include carbon, silicon carbide, boron nitride, and silicon nitride. The reactor tube material may in turn determine the preferred technique for perforating the tube. Conventional rotary drilling has been utilized for graphite tubes, although both ultrasonic drilling and laser drilling have also been successfully employed. If laser drilling is employed, perforations may be frustro-conically shaped rather than cylindrical, but this should not detract from the ability of the perforated tube to generate a protective fluid wall. Various gases other than nitrogen and argon may be used. The selected inert fluid should be substantially transparent to radiation, and should also be substantially inert with respect to the reactor tube material at various temperatures. Other suitable inert gases include hydrogen, helium, and xenon.

These and other changes and modifications may be made to the apparatus and methods described herein without departing from the spirit and scope of the present invention. Accordingly, it should be clearly understood that the embodiments described herein and shown in the accompanying drawings are exemplary only and are not intended as limitations from the scope of the invention.

What is claimed is:

1. In a high-temperature fluid-wall reactor including a cylindrical-shaped reactor tube having a central axis and formed from a refractory material, a reaction zone within said reactor tube for inputting reactants, means for heating said reaction tube to incandescence for emitting radiation radially inward to said reaction zone for maintaining a desired chemical reaction, and inlet means for providing an inert gas at a pressure differential across said reactor tube so as to form a protective fluid wall for an inner surface of said reactor tube, the improvement comprising:
    said reactor tube material being substantially impervious to gas flow;
    said reactor tube including a first portion have a plurality of perforations throughout the length thereof and spaced substantially around the perimeter of said first portion for permitting flow of said inert gas radially inward through said tube and a second portion spaced downstream from said first portion and being substantially unperforated;
    said second portion of said reactor tube being in fluid communication with said means for heating said reactor tube;
    barrier means for restricting inert gas flow from an exterior surface of said second portion of said reactor tube to an exterior surface of said first portion of said reactor tube, and being positioned for at least substantially isolating said heating means from said plurality of perforations;
    each of said plurality of perforations through said reactor tube having an aperture axis passing substantially through said axis of said reactor tube for directing said inert gas in a jetstream commencing adjacent said inner surface of said reactor tube and directed radially inward toward said reaction zone;
    said plurality of perforations being selectively spaced about said reactor tube sufficient for said differential pressure across said reactor tube to cause each of said jetstreams to engage one or more other of said jetstreams for forming an integral protective fluid wall while maintaining a radially-directed momentum sufficient to repel said reactants; and
    the radially directed velocity of each of said jetstreams diminishes within said reactor tube without disturbing fluid flow within said reaction zone.

2. The apparatus as defined in claim 1, wherein said aperture axis for each of said plurality of perforations through said reactor tube is substantially perpendicular to said central axis of said reactor tube.

3. The apparatus as defined in claim 2, wherein each of said perforations through said reactor tube has a generally cylindrical configuration formed about said aperture axis and has a diameter of about 0.020 inches or greater.

4. The apparatus as defined in claim 2, wherein said plurality of perforations are located about said reactor tube such that any line on the inner surface of said reactor tube parallel to said central axis of said reactor tube passes through a plurality of said perforations.

5. The apparatus as defined in claim 4, wherein said plurality of perforations are located on said reactor tube at lattice points of a uniform lattice pattern.

6. The apparatus as defined in claim 3, further comprising:
    said plurality of perforations each have mean diameters in the range of from 0.02 inches to 0.10 inches; and
    said plurality of perforations are spaced about said reactor tube at centerline spacings of from 0.06 inches to 0.35 inches.

7. The apparatus as defined in claim 3, further comprising:
    said plurality of perforations each have mean diameters in the range of from 0.02 inches to 0.035 inches; and
    said plurality of perforations are spaced about said reactor tube at centerline spacings of from 0.06 inches to 0.15 inches.

8. The apparatus as defined in claim 1, wherein said reactor tube material has a thermal conductivity in a radial direction with respect to said central axis of at least 16 BTU/ft.-hr.-°F. at 4000° F.

9. The apparatus as defined in claim 1, wherein said means for heating said reaction tube is positioned for maintaining substantially laminar flow of said inert gas downstream of said first portion to maintain said protective fluid wall throughout the length of said second portion.

10. A method for forming a fluid wall in a high temperature reactor of the type employing a reaction zone for inputting reactants within a reactor tube, heating means for heating said reactor tube to incandescence for emitting radiation radially inward from said reactor tube to maintain a desired chemical reaction, and inlet means for providing an inert gas for forming a protective fluid wall for an inner surface of said reactor tube, said method comprising:
    perforating a first portion of said reactor tube with a plurality of perforations through said reactor tube each having a linear perforation axis passing substantially through a central axis of said reactor tube and at selected spacings relative to adjacent perforations;
    providing a second unperforated portion at said reactor tube spaced downstream of said first portion;
    passing said inert gas inwardly through said plurality of perforations at a pressure differential across said reactor tube sufficient for forming inert gas jetstreams each maintaining radially-directed momentum sufficient to repel said reactants while overlapping adjacent jetstreams for forming an integral protective fluid wall;
    controlling the velocity of said jetstreams sufficient for substantially terminating a radially-directed velocity component of said jetstreams before reaching said reaction zone; and
    controlling the flow rate of said inert gas passing through said perforations for obtaining laminar flow downstream from said first portion of said reactor tube to maintain said fluid wall within said second portion of said reactor tube.

11. A method as defined in claim 10, further comprising:
   forming a first chamber at least partially defined by an outer surface of said first portion of said reactor tube;
   forming a second chamber at least partially defined by an outer surface of said second portion of said reactor tube and housing said heating means;
   passing said inert gas from said inlet means into said first chamber and thence through said plurality of perforations; and
   prohibiting inert gas flow from said second chamber to said outer surface of said first portion of said reactor tube.

12. A method as defined in claim 10, wherein
   each of said perforations has a generally cylindrical configuration about said perforation axis; and
   said perforation axis is substantially perpendicualr to said central axis of said reactor tube.

13. A method as defined in claim 10, wherein the step of perforating said reactor tubes at selected spacings comprises:
   locating said plurality of perforations about said reactor tube such that any line on the inner surface of said reactor tube parallel to said central axis of said reactor tube passes through a plurality of said perforations.

14. A method as defined in claim 10, wherein:
   the step of perforating said first portion of said reactor tube includes forming each of said plurality of perforations through said reactor tube with a mean diameter in the range of from 0.03 inches to 0.09 inches; and
   the step of perforating said reactor tube at selected spacings includes positioning said plurality of perforations at centerline spacings of from 0.10 inches to 0.30 inches.

15. The method as defined in claim 10, wherein said controlling the flow rate of inert gas comprises controlling both the flow rate of said inert gas and temperature of said inert gas in said reactor tube are controlled to maintain said fluid wall throughout the length of said second portion of said reactor tube.

16. A method for forming a fluid wall in a high temperature reactor of the type employing a reaction zone within tube for inputting reactants and passing radiation radially inward through said fluid wall for maintaining a desired chemical reaction, said method comprising:
   perforating said reactor tube with a plurality of perforations through a first section of said reactor tube each having an aperture axis passing substantially through a central axis of said reactor tube;
   passing an inert gas inward through said plurality of perforations at a pressure differential across said reactor tube sufficient for forming inert gas jetstreams;
   selectively spacing said plurality of perforations about said reactor tube such that said jetstreams maintain a radially-directed momentum sufficient to repel said reactants while overlapping for forming an integral fluid wall for protecting said first section of said reactor tube;
   providing a second unperforated section of said reactor tube downstream from said first section; and
   controlling the flow rate of said inert gas passing through said plurality of perforations sufficient for obtaining laminer flow of said inert gas downstream from said first section and thereby maintaining said fluid wall within said second section to protect said second section of said reactor tube.

17. A method as defined in claim 16, wherein said controlling of the flow rate of said inert gas further comprises:
   controlling the flow rate and temperature of said inert gas passing through said perforations in said first section for obtaining said laminar flow downstream from said first section.

18. A method as defined in claim 17, wherein said flow rate is controlled by maintaining an inert gas pressure differential across said reactor tube in the range of from 3.0 scfm to 11.3 scfm per square foot of internal reactor tube containing said perforations.

19. A method as defined in claim 16, further comprising:
   positioning said first section of said reactor tube in the vicinity adjacent an inlet feed tube for said reactor; and
   positioning said second section of said second reactor tube in the vicinity of heating elements for said reactor.

20. A method as defined in claim 16, further comprising:
   forming a first chamber at least partially defined by the outer surface of said first section of said reactor tube;
   forming a second chamber at least partially defined by said second unperforated section of said reactor tube and housing heating means for heating said reactor tube;
   prohibiting inert gas flow from said second chamber to said outer surface of said first section of said reactor tube;
   heating said inert gas; and
   thereafter passing said inert gas into said first chamber and thence through said pulurality of perforations.

21. A method as defined in claim 16, further comprising:
   providing a third perforated section of said reactor tube downstream from said second unperforated section of said reactor tube; and
   passing said inert gas radially inward through perforations in said third section of said reactor tube for maintaining a protective fluid wall for said third section of said reactor tube.

22. A method as defined in claim 16 wherein the step of selectively spacing said plurality of perforations about said reactor tube includes positioning said perforations at centerline spacings of from 0.10 inches to 0.30 inches.

23. The method as defined in claim 16, further comprising:
   forming a first chamber at least partially defined by an outer surface of said first portion of said reactor tube;
   forming a second chamber at least partially defined by an outer surface of said second portion of said reactor tube and housing said heating means;
   passing said inert gas from an inlet means into said first chamber and thence through said plurality of perforations; and
   at least substantially prohibiting inert gas flow from said second chamber to said outer surface of said first portion of said reactor tube.

* * * * *